US010584417B2

(12) United States Patent
Ito et al.

(10) Patent No.: US 10,584,417 B2
(45) Date of Patent: Mar. 10, 2020

(54) FILM FORMING APPARATUS, SUSCEPTOR, AND FILM FORMING METHOD

(71) Applicant: NuFlare Technology, Inc., Yokohama-shi, Kanagawa-ken (JP)

(72) Inventors: Hideki Ito, Kanagawa (JP); Hidekazu Tsuchida, Kanagawa (JP); Isaho Kamata, Tokyo (JP); Masahiko Ito, Kanagawa (JP); Masami Naito, Aichi (JP); Hiroaki Fujibayashi, Aichi (JP); Katsumi Suzuki, Aichi (JP); Koichi Nishikawa, Aichi (JP)

(73) Assignee: NuFlare Technology, Inc., Yokohama-shi (JP)

( * ) Notice: Subject to any disclaimer, the term of this patent is extended or adjusted under 35 U.S.C. 154(b) by 145 days.

(21) Appl. No.: 14/796,172

(22) Filed: Jul. 10, 2015

(65) Prior Publication Data

US 2016/0024652 A1 Jan. 28, 2016

(30) Foreign Application Priority Data

Jul. 24, 2014 (JP) .................. 2014-150763

(51) Int. Cl.
*C30B 25/12* (2006.01)
*C30B 29/36* (2006.01)
(Continued)

(52) U.S. Cl.
CPC .......... *C23C 16/46* (2013.01); *C23C 16/4588* (2013.01); *C30B 25/08* (2013.01); *C30B 25/12* (2013.01); *C30B 29/36* (2013.01)

(58) Field of Classification Search
CPC . C23C 16/4581; C23C 16/46; C23C 16/4588; C23C 16/4585; H01L 21/68735; C30B 25/12; C30B 25/08
See application file for complete search history.

(56) References Cited

U.S. PATENT DOCUMENTS 5,411,763 A * 5/1995 Weaver .................. C04B 35/565
427/249.15
5,958,140 A * 9/1999 Arami ............... C23C 16/45502
118/725
(Continued)

FOREIGN PATENT DOCUMENTS

JP 4-10333 1/1992
JP 06-053139 2/1994
(Continued)

OTHER PUBLICATIONS

Notification of Reasons for Rejection dated Aug. 10, 2016, issued by the Korean Intellectual Property Office in corresponding Korean Application No. 10-2015-0100419, with translation, 10 pages.
(Continued)

*Primary Examiner* — Charlee J C Bennett
(74) *Attorney, Agent, or Firm* — Finnegan, Henderson, Farabow, Garrett & Dunner, L.L.P.

(57) ABSTRACT

A film forming apparatus according to an embodiment of the invention includes: a film forming chamber configured to form a film on a substrate; a susceptor configured to place the substrate thereon; a rotating part configured to rotate the susceptor; a heater configured to heat the substrate; and a gas supplier configured to supply process gases into the film forming chamber, wherein the susceptor includes: a ring-shaped outer circumferential susceptor supported by the rotating part; a holder provided at an inner circumferential portion of the outer circumferential susceptor, the holder configured to hold the substrate; a ring-shaped plate provided over the outer circumferential susceptor; and a cover member configured to cover a top surface and an outer circumferential surface of the plate and an outer circumferential surface of the outer circumferential susceptor.

18 Claims, 1 Drawing Sheet

(51) Int. Cl.
*C30B 25/08* (2006.01)
*C23C 16/46* (2006.01)
*C23C 16/458* (2006.01)

(56) References Cited

U.S. PATENT DOCUMENTS

| | | | | |
|---|---|---|---|---|
| 6,117,349 | A * | 9/2000 | Huang | H01J 37/32431 156/345.3 |
| 6,133,152 | A * | 10/2000 | Bierman | C23C 16/4401 118/730 |
| 6,464,794 | B1 * | 10/2002 | Park | C23C 16/4583 118/724 |
| 6,466,426 | B1 * | 10/2002 | Mok | H01L 21/67098 257/717 |
| 7,060,944 | B2 * | 6/2006 | Ose | H01L 21/67103 118/724 |
| 8,854,790 | B1 * | 10/2014 | Hsieh | H01L 21/68735 361/234 |
| 9,425,077 | B2 * | 8/2016 | Hsieh | H01L 21/68735 |
| 2001/0027970 | A1 * | 10/2001 | Li | H01L 21/67103 219/390 |
| 2001/0052324 | A1 * | 12/2001 | Rupp | C23C 16/4581 118/728 |
| 2003/0047281 | A1 * | 3/2003 | Hirose | C23C 16/4586 156/345.33 |
| 2003/0079689 | A1 * | 5/2003 | Sumakeris | C23C 16/4581 118/725 |
| 2004/0196613 | A1 * | 10/2004 | Zheng | H01L 21/6831 361/234 |
| 2005/0133166 | A1 * | 6/2005 | Satitpunwaycha | H01J 37/321 156/345.51 |
| 2006/0075972 | A1 * | 4/2006 | Nakashima | C23C 16/4584 118/729 |
| 2007/0169891 | A1 * | 7/2007 | Koshiishi | H01J 37/32642 156/345.47 |
| 2007/0218664 | A1 * | 9/2007 | Ito | C23C 16/4584 438/565 |
| 2009/0068851 | A1 * | 3/2009 | Hirata | C23C 16/4584 438/778 |
| 2010/0064972 | A1 * | 3/2010 | Yamasaki | C23C 16/4585 118/724 |
| 2010/0108108 | A1 * | 5/2010 | Hayashi | H01L 21/02063 134/115 R |
| 2012/0024479 | A1 * | 2/2012 | Palagashvili | C23C 16/4412 156/345.54 |
| 2013/0247826 | A1 * | 9/2013 | Tzu | C23C 16/46 118/725 |

FOREIGN PATENT DOCUMENTS

| | | |
|---|---|---|
| JP | 07-245264 A | 9/1995 |
| JP | 2005-86230 | 3/2006 |
| JP | 2006-60195 | 3/2006 |
| JP | 2008-262967 | 10/2008 |
| JP | 2009-164162 | 7/2009 |
| JP | 2010-109297 A | 5/2010 |
| JP | 2011-014682 A | 1/2011 |
| KR | 10-2011-0024381 A | 3/2011 |
| TW | 201306167 A | 2/2013 |
| WO | WO 2011/114858 A1 | 9/2011 |

OTHER PUBLICATIONS

TW Official Action dated Apr. 25, 2016 for corresponding Taiwanese patent application No. 104120947, with Translation.
Notification of Reason for Rejection issued by the Japanese Patent Office dated Nov. 17, 2017, for Japanese Patent Application No. 2014-150763, and English-language translation thereof.
Notification of Reason for Rejection issued by the Japanese Patent Office dated Jul. 3, 2018, for Japanese Patent Application No. 2014-150763, and English-language translation.

* cited by examiner

FILM FORMING APPARATUS, SUSCEPTOR, AND FILM FORMING METHOD

CROSS REFERENCE TO RELATED APPLICATIONS

This application is based upon and claims the benefit of priority from the prior Japanese Patent Application No. 2014-150763, filed on Jul. 24, 2014, the entire contents of which are incorporated herein by reference.

FIELD

The embodiments of the present invention relate to a film forming apparatus, susceptor, and film forming method.

BACKGROUND

In a manufacturing process of a semiconductor element that requires a crystal film relatively large in the film thickness as in a power device such as an IGBT (Insulated Gate Bipolar Transistor), an epitaxial growth technique that enables to form a film by vapor-phase growing a single-crystal thin film on a substrate such as a wafer is conventionally used.

In a film forming apparatus used in the epitaxial growth technique, for example, a wafer is placed inside of a film forming chamber kept at an ordinary pressure or a reduced pressure. While the wafer is heated, gases serving as materials for film formation (hereinafter, also simply "material gases") are supplied into the film forming chamber. A pyrolysis reaction and a hydrogen reduction reaction of the material gases then occur on a surface of the wafer and an epitaxial film is formed on the wafer.

To manufacture an epitaxial wafer large in the film thickness at high yield, it is necessary to successively bring fresh material gases into contact with the surface of the wafer uniformly heated to increase the rate of vapor-phase growth. For this purpose, the epitaxial growth is performed while the wafer is rotated.

In a conventional SIC epitaxial apparatus, an SIC film is deposited not only on a wafer but also on a surface of a susceptor that holds the wafer. A structure in which a cover is mounted on the susceptor to protect the susceptor is therefore used.

When SIC is used for the susceptor, under a high temperature equal to or higher than 1400° C., there is such a problem that SiC of the susceptor sublimates due to a temperature difference from the wafer at a position where the wafer is placed on the susceptor and adheres to the bottom surface of the wafer. When a material other than SIC is then used for the susceptor, SIC deposited on the susceptor easily peels off and becomes a particle source.

When a cover of an SiC material is provided on the susceptor as mentioned above to solve this problem, SIC of the cover then sublimates and adversely adheres to the susceptor this time. An object of the present invention is to provide a film forming apparatus, a susceptor unit, and a film forming method that can suppress adherence of SiC to a susceptor.

SUMMARY

A film forming apparatus according to an embodiment of the invention includes: a film forming chamber configured to form a film on a substrate; a susceptor configured to place the substrate thereon; a rotating part configured to rotate the susceptor; a heater configured to heat the substrate; and a gas supplier configured to supply process gases into the film forming chamber, wherein
the susceptor includes: a ring-shaped outer circumferential susceptor supported by the rotating part; a holder provided at an inner circumferential portion of the outer circumferential susceptor, the holder configured to hold the substrate; a ring-shaped plate provided over the outer circumferential susceptor; and a cover member configured to cover a top surface and an outer circumferential surface of the plate and an outer circumferential surface of the outer circumferential susceptor.

A susceptor according to an embodiment of the invention being provided in a film forming chamber in which a film is formed on a substrate, the substrate being placed on the susceptor, the susceptor includes: a ring-shaped outer circumferential susceptor; a holder provided at an inner circumferential portion of the outer circumferential susceptor, the holder configured to hold the substrate; a ring-shaped plate provided on the outer circumferential susceptor; and a cover member configured to cover a top surface and an outer circumferential surface of the plate and an outer circumferential surface of the outer circumferential susceptor.

A film forming method according to an embodiment of the invention includes: loading a holder, a ring-shaped plate and a cover member into a film forming chamber together with an SiC substrate, the holder holding the SIC substrate, the cover member covering a top surface and an outer circumferential surface of the plate; wherein the plate is provided on the outer circumferential susceptor, and the holder is provided at an inner circumferential portion of the outer circumferential susceptor; supplying process gases including an SiC source gas into the film forming chamber and forming a film on the SiC substrate; and loading the holder holding the SiC substrate, the plate, and the cover member out of the film forming chamber after film formation on the SiC substrate.

DETAILED DESCRIPTION

Embodiments will now be explained with reference to the accompanying drawings. The present invention is not limited to the embodiments.

Figure 1:
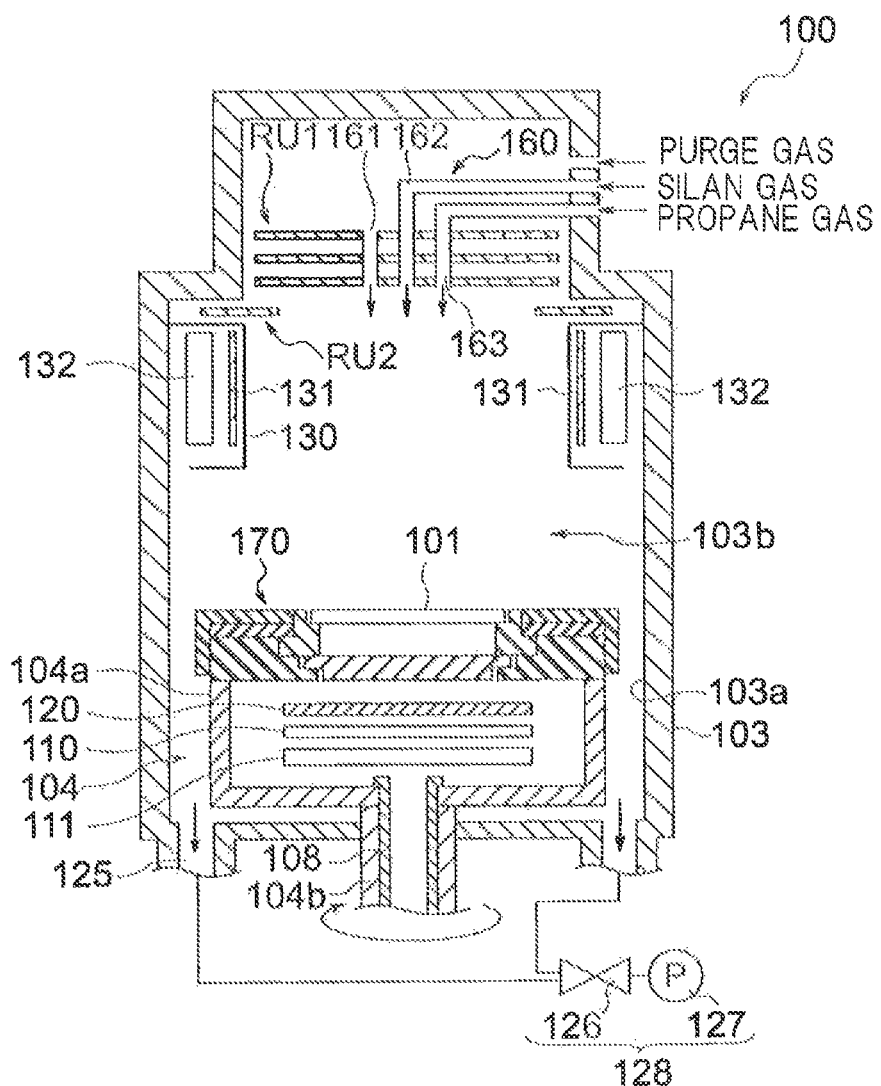
FIG. 1 is a schematic configuration diagram of a film forming apparatus according to an embodiment.

FIG. 1 is a schematic configuration diagram of a film forming apparatus according to an embodiment. A substrate 101 made of SIC is used as a sample serving as a target of a film forming process. In FIG. 1, a state where the substrate 101 is placed on a susceptor unit 170 is shown. Plural kinds of gases (process gases) serving as materials for forming an SIC epitaxial film are supplied onto the substrate 101 placed on the susceptor unit 170 and a vapor-phase growth reaction is caused on the substrate 101 to form a film.

A film forming apparatus 100 has a chamber 103 serving as a film forming chamber in which film formation of an SIC epitaxial film is performed by causing vapor-phase growth on the substrate 101, The susceptor unit 170 is provided above a rotating part 104 inside of the chamber 103.

Figure 2:
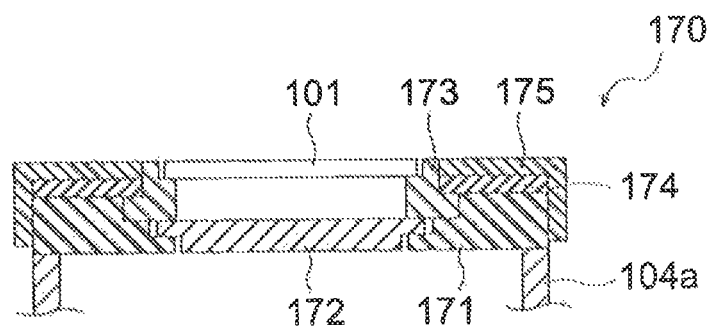
FIG. 2 is a schematic configuration diagram of a susceptor according to an embodiment.

As shown in FIG. 2, the susceptor unit 170 includes a susceptor constituted by an outer circumferential susceptor 171 having a shape of a ring configured to have an opening, an internal susceptor 172 provided on an inner side of the outer circumferential susceptor 171 to close the opening, and a holder 173 that is provided on the internal susceptor 172 along an inner circumference of the outer circumferential susceptor 171 to hold the substrate 101, a ring-shaped plate 174 provided on the outer circumferential susceptor 171 and a part of the holder 173, and a cover member 175 that is provided on the plate 174 to cover a top surface and an outer circumferential surface of the plate 174 and an outer circumferential surface of the outer circumferential susceptor 171 and that has at least a part of its surface made of SIC. That is, the susceptor unit 170 has a structure in which the plate 174 is provided between the susceptor and the cover member 175. A plurality of the plates 174 can be alternatively provided.

A counterbore is provided on an inner circumferential side of the holder 173 and the holder 173 has a structure to receive and support an outer circumferential portion of the substrate 101 within the counterbore.

The holder 173, the plate 174, and the cover member 175 are attachable to and detachable from the outer circumferential susceptor 171 and the internal susceptor 172.

The outer circumferential susceptor 171, the internal susceptor 172, and the holder 173 are made of a material, at least the surface of which is other than SIC, such as TaC or carbon coated with TaC on the surface. The plate 174 is made of a material that does not sublimate at a processing temperature between 1400° C. and 1700° C. and a material, at least the surface of which is other than SiC, such as a graphite material, a carbon fiber material, or TaC. The cover member 175 is made of a material, at least the surface of which is formed of SIC, such as SiC or carbon coated with SiC on the surface.

The structure of the susceptor unit 170 is not limited to that shown in FIG. 2. For example, the internal susceptor 172 can be omitted.

As shown in FIG. 1, the rotating part 104 has a cylindrical part 104a and a rotating shaft 104b. The rotating part 104 supports the susceptor unit 170 at an upper portion of the cylindrical part 104a. By rotating the rotating shaft 104b with a motor (not shown), the susceptor unit 170 is rotated via the cylindrical part 104a. When the substrate 101 is placed on the susceptor unit 170, the substrate 101 can be thus rotated.

In FIG. 1, the cylindrical part 104a has an opening at an upper portion and has a structure opened at the upper portion. A heater (a main heater) 120 is provided in the cylindrical part 104a. A resistive heater can be used for the heater 120 and the heater 120 can be made of carbon (C) material having a predetermined resistance value, for example. The heater 120 is fed with power via a wire (not shown) passing inside of a substantially-cylindrical quartz shaft 108 provided in the rotating shaft 104b and heats the substrate 101 from a bottom surface thereof.

A reflector 110 is provided in the cylindrical part 104a below the heater 120 to effectively perform heating by the heater 120. The reflector 110 is made of a high heat-resistant material such as carbon, SiC, or carbon coated with SIC. A heat-insulating material 111 is provided below the reflector 110 to prevent heat from the heater 120 from transferring to the shaft 108 and the like and can reduce heater power during heating.

A lift pin (not shown) is provided as substrate lifting means inside of the shaft 108. A lower end of the lift pin extends to a lifting device (not shown) provided at a lower portion of the shaft 108. By operating the lifting device, the lift pin can be lifted or lowered. The lift pin is used when the holder 173 that holds the substrate 101 is carried into the chamber 103 and carried out of the chamber 103 together with the plate 174 and the cover member 175. The lift pin supports the holder 173 from below and raises the holder 173 to be separated from the outer circumferential susceptor 171 and the internal susceptor 172. To enable delivery of the holder 173 that holds the substrate 101, the plate 174, and the cover member 175 to/from a transfer robot (not shown), the lift pin operates to arrange the holder 173 at a predetermined position away from and above the outer circumferential susceptor 171 and the internal susceptor 172 on the rotating part 104.

A gas discharge part 125 for discharging gases is provided at a lower portion of the chamber 103. The gas discharge part 125 is connected to a discharge mechanism 128 including an adjusting valve 126 and a vacuum pump 127. The discharge mechanism 128 is controlled by a control mechanism (not shown) to adjust the inside of the chamber 103 to a predetermined pressure.

A cylindrical liner 130 is provided in the chamber 103, which separates a film forming area in which the film forming process is performed and a side wall (an inner wall) 103a of the chamber 103 from each other. The liner 130 is made of a high heat-resistant material such as carbon or carbon coated with SiC.

An auxiliary heater 131 that heats the substrate 101 from above is provided between the liner 130 and the sidewall 103a. The auxiliary heater 131 is a resistive heater, for example. A heat-insulating material 132 is provided between the auxiliary heater 131 and the sidewall 103a to prevent heat from the auxiliary heater 131 from transferring to the chamber 103. Accordingly, heater power during heating can be reduced.

Reflector units RU1 and RU2 that reflect radiation from the heater 120 and the auxiliary heater 131 are provided at an upper portion of the chamber 103 of the film forming apparatus 100 to increase thermal efficiency. The reflector units RU2 are provided below the reflector units RU1.

The reflector units RU1 and RU2 are made of a thin plate using carbon, SiC, or carbon coated with SiC. The reflector units RU1 and RU2 can be each made of one thin plate or made by laminating a plurality of thin plates.

As shown in FIG. 1, a gas supplier 160 is provided at an upper portion of the chamber 103 of the film forming apparatus 100. The gas supplier 160 supplies process gases such as a purge pas, an SiC source gas, and a doping gas to the film forming area via gas passages (gas pipes) 161 to 163, respectively. For example, an argon gas or a hydrogen gas serving as the purge gas is supplied to a film forming area 103b via the gas passage 161. A silane gas and a propane gas are supplied as the SIC source gas to the film forming area 103b via the gas passages 162 and 163, respectively. A nitrogen gas is supplied as the doping gas via a gas passage (not shown). While one gas passage is provided for each gas in FIG. 1, a plurality of gas passages can be provided for each gas.

Alternatively, a radiation thermometer can be provided at an upper portion of the chamber 103 to measure the temperature of the substrate 101. In this case, a quartz glass window is provided at a part of the chamber 103 and the temperature of the substrate 101 is measured with the radiation thermometer through the quartz glass window.

A film forming method according to the present embodiment is explained next.

First, the substrate 101, the holder 173 that holds the substrate 101, the plate 174, and the cover member 175 are carried into the chamber 103 and are placed on the outer circumferential susceptor 171 and the internal susceptor 172. At this time, the cover member 175 covers the outer circumferential surface of the outer circumferential susceptor 171.

Next, the substrate 101 is heated by the heater 120 and the auxiliary heater 131 at a rate of about 150° C./minute to reach a temperature equal to or higher than 1500° C., While the substrate 101 is rotated by the rotating part 104, the gas supplier 160 supplies the SiC source gas and the doping gas. Accordingly, an SiC epitaxial film is formed on the substrate 101. At this time, the SIC film is formed also on the surface of the cover member 175 as well as on the substrate 101. However, because the outer circumferential surface of the outer circumferential susceptor 171 is covered by the cover member 175, adherence of SiC to the outer circumferential surface of the outer circumferential susceptor 171 can be prevented.

The plate 174 is provided between the outer circumferential susceptor 171 and a top surface of the holder 173, and the cover member 175. Accordingly, it is possible to prevent SIC formed on the cover member 175 from sublimating and adhering to the outer circumferential susceptor 171 and the holder 173.

When SIC adheres to the outer circumferential susceptor 171, the outer circumferential susceptor 171 may be deformed due to a difference in thermal expansion coefficients. However, in the present embodiment, adherence of SiC to the outer circumferential susceptor 171 is prevented by the cover member 175 and the plate 174 and thus deformation of the outer circumferential susceptor 171 can be avoided. Accordingly, the substrate 101 can be rotated at a high speed and a uniform SIC epitaxial film can be formed on the substrate 101.

Furthermore, as shown in FIG. 2, the holder 173 made of TaC or carbon coated with TaC on the surface is interposed between the substrate 101 and the cover member 175. That is, the cover member 175 is provided away from a substrate holding area of the holder 173 with the holder 173 interposed therebetween. Accordingly, SiC formed on the cover member 175 is prevented from sublimating and adhering to the substrate 101 and a uniform SIC epitaxial film can be formed on the substrate 101.

After an SiC epitaxial film is formed on the substrate 101, the temperature in the chamber 103 is lowered and the purge gas is supplied therein. The substrate 101 is then carried out of the chamber 103 together with the holder 173, the plate 174, and the cover member 175.

At this time, it is possible to carry the substrate 101 carried out of the chamber 103 to a replacement chamber provided outside of the chamber 103 together with the holder 173, the plate 174, and the cover member 175 and then remove the substrate 101.

Because the cover member 175 is made of SiC or carbon coated with SiC on the surface, an SIC film formed on the surface is less likely to be peeled off than in a case where the cover member 175 is made of another material and peel-off of the SiC film at the time of carrying out of the chamber 103, which becomes a particle source, can be prevented.

The substrate 101 is removed from the holder 173 outside of the chamber 103. When the amount of SIC adhered to the cover member 175 or the plate 174 is large, the cover member 175 or the plate 174 is replaced with a new (or cleaned) cover member 175 or plate 174. Even when the adhered SIC film peels off, the peeled SIC film can be easily handled and prevented from being a particle source in the chamber 103 because replacement of the cover member 175 and the plate 174 is performed outside of the chamber 103.

Another substrate 101 is then attached to the holder 173 and the substrate 101 is carried into the chamber 103 together with the holder 173, the plate 174, and the cover member 175.

As described above, according to the present embodiment, adherence of SIC to the susceptor (the outer circumferential susceptor 171) can be prevented by provision of the cover member 175. Furthermore, by providing the plate 174 between the cover member 175 and the outer circumferential susceptor 171, it is possible to prevent SiC having sublimated from the cover member 175 from adhering to the outer circumferential susceptor 171. Accordingly, deformation of the susceptor caused by a difference in the thermal expansion coefficients can be prevented, the substrate 101 can be rotated at a high speed, and a uniform SiC film can be formed on the substrate 101.

Furthermore, as the plate 174 and the cover member 175 are carried out of the chamber 103 together with the substrate 101 and the plate 174 and the cover member 175 are replaced outside of the chamber 103, it is possible to prevent peeled SiC from becoming a particle source.

In the SiC epitaxial growth, nitrogen is used as the doping gas. Therefore, it is preferable that a nitrogen impurity concentration of the plate 174 in the present embodiment is low and is, for example, 1E18 atoms/cm$^3$ or lower.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A film forming apparatus comprising:
a film forming chamber configured to form a film on a substrate;
a susceptor unit configured to place the substrate thereon;
a rotating part below the susceptor unit;
a heater configured to heat the substrate; and
a gas supplier connected to the film forming chamber and configured to supply SiC process gases,
wherein the susceptor unit comprises:
an outer susceptor;
an internal susceptor provided on an inner side of the outer susceptor;
a holder on the internal susceptor and the outer susceptor and comprising a counterbore;
a cover member comprising a horizontal portion and a vertical portion, the cover member being provided above the outer susceptor, a material of the cover member being different from a material of the outer susceptor, and a surface of the cover member being covered by SiC; and
a ring-shaped plate provided between the outer susceptor and the cover member, a material of a surface of the ring-shaped plate being different from a material of the surface of the cover member,
wherein
the horizontal portion of the cover member fully covers a top surface of the ring-shaped plate,
the vertical portion of the cover member fully covers an outer circumferential surface of the ring-shaped plate, the ring-shaped plate fully covers a top surface of the outer susceptor, the ring-shaped plate contacts the horizontal portion and the vertical portion of the cover member, a bottom surface of the ring-shaped plate contacts the outer susceptor and the holder, and the holder contacts the horizontal portion of the cover member.

2. The apparatus of claim 1, wherein the ring-shaped plate and the cover member are attachable to and detachable from the susceptor.

3. The apparatus of claim 1, wherein the cover member is separated from a substrate holding area of the susceptor.

4. The apparatus of claim 1, wherein the susceptor is made of TaC or carbon coated with TaC.

5. The apparatus of claim 1, wherein the cover member is made of SiC or carbon coated with SiC.

6. The apparatus of claim 1, wherein at least a surface of the ring-shaped plate is made of a graphite material, a carbon fiber material, or TaC.

7. A susceptor unit provided in a film forming chamber in which a film is formed on a substrate, the substrate being placed on the susceptor unit, the susceptor unit comprising:
an outer susceptor;
an internal susceptor provided on an inner side of the outer susceptor;
a holder on the internal susceptor and the outer susceptor and comprising a counterbore;
a cover member comprising a horizontal portion and a vertical portion, the cover member being provided above the outer susceptor, a material of the cover member being different from a material of the outer susceptor, and a surface of the cover member being covered by SiC; and
a ring-shaped plate provided between the outer susceptor and the cover member, a material of a surface of the ring-shaped plate being different from a material of the surface of the cover member,
wherein
the horizontal portion of the cover member fully covers a top surface of the ring-shaped plate,
the vertical portion of the cover member fully covers an outer circumferential surface of the ring-shaped plate,
the ring-shaped plate fully covers a top surface of the outer susceptor,
the ring-shaped plate contacts the horizontal portion and the vertical portion of the cover member,
a bottom surface of the ring-shaped plate contacts the outer susceptor and the holder, and
the holder contacts the horizontal portion of the cover member.

8. The susceptor unit of claim 7, wherein the ring-shaped plate and the cover member are attachable to and detachable from the susceptor.

9. The susceptor unit of claim 7, wherein the cover member is separated from a substrate holding area of the susceptor.

10. The susceptor unit of claim 7, wherein the susceptor is made of TaC or carbon coated with TaC.

11. The susceptor unit of claim 7, wherein the cover member is made of SiC or carbon coated with SiC.

12. The susceptor unit of claim 7, wherein at least a surface of the ring-shaped plate is made of a graphite material, a carbon fiber material, or TaC.

13. A film forming apparatus comprising:
a film forming chamber configured to form a film on a substrate;
a susceptor unit configured to place the substrate thereon;
a rotating part below the susceptor unit;
a heater configured to heat the substrate; and
a gas supplier connected to the film forming chamber and configured to supply SiC process gases,
wherein the susceptor unit comprises:
an outer susceptor;
an internal susceptor provided on an inner side of the outer susceptor;
a holder on the internal susceptor and the outer susceptor and comprising a counterbore;
a cover member comprising a horizontal portion and a vertical portion, the cover member being provided above susceptor, a material of the cover member being different from a material of the outer susceptor, and a surface of the cover member being covered by SiC; and
a ring-shaped plate provided between the outer susceptor and the cover member, a material of a surface of the ring-shaped plate being different from a material of the surface of the cover member,
wherein
the horizontal portion of the cover member fully covers a top surface of the ring-shaped plate,
the vertical portion of the cover member fully covers an outer circumferential surface of the ring-shaped plate,
the ring-shaped plate fully covers a top surface of the outer susceptor,
the holder contacts a horizontal surface of the outer susceptor and a vertical surface of the outer susceptor,
the outer susceptor contacts a horizontal surface of the inner susceptor, and
the outer susceptor contacts the vertical portion of the cover member.

14. The apparatus of claim 13, wherein the ring-shaped plate and the cover member are attachable to and detachable from the susceptor.

15. The apparatus of claim 13, wherein the cover member is separated from a substrate holding area of the susceptor.

16. The apparatus of claim 13, wherein the susceptor unit is made of TaC or carbon coated with TaC.

17. The apparatus of claim 13, wherein the cover member is made of SiC or carbon coated with SiC.

18. The apparatus of claim 13, wherein at least a surface of the ring-shaped plate is made of a graphite material, a carbon fiber material, or TaC.

* * * * *